United States Patent [19]
Hemdal et al.

[11] Patent Number: 5,999,042
[45] Date of Patent: Dec. 7, 1999

[54] SWITCHABLE RESPONSE ACTIVE FILTER

[75] Inventors: Hakan O. Hemdal; Jeffrey M. Brooke, both of Colorado Springs, Colo.

[73] Assignee: Plasmon LMS, Inc., Colorado Springs, Colo.

[21] Appl. No.: 09/050,580

[22] Filed: Mar. 30, 1998

[51] Int. Cl.[6] ............................................. H03K 5/00
[52] U.S. Cl. ........................ 327/554; 327/558; 327/337; 330/9
[58] Field of Search ........................... 327/552, 554, 327/558, 336, 337; 330/9

[56] References Cited

U.S. PATENT DOCUMENTS 5,293,087  3/1994  Hamao et al. ............................ 327/558

*Primary Examiner*—Dinh T. Le
*Attorney, Agent, or Firm*—Craig J. Lervick

[57] ABSTRACT

A switchable active filter circuit is formed which employs a ground based switch to direct a portion of a feedback current away from a virtual ground terminal of an operational amplifier, thereby providing enhanced circuit Q and greater phase control at frequencies approaching an octave from the unity gain crossover frequency of an operational amplifier used to form the filter. The circuit employs a switchable feedback tee which includes a first capacitor, a second capacitor, a third capacitor and a switch. The first capacitor and the second capacitor form a first series circuit which is connected from the output terminal to the input terminal of the operational amplifier. The third capacitor and the first switch are connected as a second series circuit which is coupled from circuit ground potential to a junction of the first capacitor and the second capacitor. When the switch is closed, a feedback current flowing in the feedback tee is divided with a portion of the current flowing through the third capacitor to circuit ground, rather than into the virtual ground terminal of the operational amplifier. This filter topology is particularly well suited for use in a multi-mode read/write channel of a tape storage system.

13 Claims, 6 Drawing Sheets

$$\frac{V_2}{V_1} = \frac{-Y_1 Y_3}{Y_5(Y_1+Y_2+Y_3+Y_4) + Y_3 Y_4}$$

| FILTER DESIRED | $Y_1$ | $Y_2$ | $Y_3$ | $Y_4$ | $Y_5$ |
|---|---|---|---|---|---|
| LOW-PASS | RESISTOR | CAPACITOR | RESISTOR | RESISTOR | CAPACITOR |
| HIGH-PASS | CAPACITOR | RESISTOR | CAPACITOR | CAPACITOR | RESISTOR |
| BANDPASS | RESISTOR | RESISTOR | CAPACITOR | CAPACITOR | RESISTOR |

SWITCHABLE RESPONSE ACTIVE FILTER

BACKGROUND OF THE INVENTION

1. Field of the Invention

The present invention relates generally to active filters and, more particularly, relates to a switchable low pass filter having a multiple feedback topology.

2. Description of the Related Art

Active filters are well known in the art. A variety of circuit topologies exist for performing low pass, high pass and band pass functions. By the selection of circuit topology and component values, a wide range of frequency responses can be achieved.

FIG. 1 illustrates a general form of one such circuit topology, commonly referred to as an infinite gain, multiple feedback realization. FIG. 1A provides the generalized transfer function for this topology and FIG. 1B provides a table illustrating the specific component types required to realize various filter functions. By selecting the appropriate values for the admittances Y1 through Y5, a desired filter cut off frequency and second order filter response is attained.

In many applications, it is desirable to provide a filter which is dynamically switchable from a first frequency response to at least a second frequency response. This is often the case when signals of different frequencies need to be applied to the filter at different times. FIG. 2 illustrates a switchable second order low pass filter known in the prior art which uses the multiple feedback topology of FIG. 1A. Referring to FIG. 2, the circuit includes an operational amplifier A1 which functions as the active element. Signals are applied to the circuit through a first resistor R1 which is connected in series with a second resistor R2 and through R2 to an inverting input of the operational amplifier A1. At the junction of R1 and R2 is a first capacitor C1 which is connected in series with a second capacitor C2 which is connected to circuit ground.

A first electrically controllable switch S1 is coupled across the second capacitor C2. By operating switch S1, the total capacitance of the series circuit is altered. When the switch is in an open condition, the total capacitance is equal to the series combination of C1 and C2, which is stated as:

Ct=(C1*C2)/(C1+C2)

where Ct is the total capacitance of the series circuit. When the switch S1 is in a closed condition, the second capacitor C2 is bypassed and Ct=C1. Accordingly, when the switch is closed, Ct is a larger value which results in a lower frequency response of the filter.

The circuit further includes a third resistor R3 which is coupled in feedback from the output of the operational amplifier A1 to the junction of resistors R1 and R2. A third capacitor C3 is also included and is coupled from the output of the operational amplifier A1 to the inverting input of the operational amplifier A1. To complete the circuit, a series circuit including a second electrically controllable switch S2, a fourth capacitor C4 and a third controllable switch S3 is coupled in parallel with the third capacitor C3. When switches S2 and S3 are in an open condition, the total value of the feedback capacitance, Cf, is equal to the value of C3. When S2 and S3 are in the closed condition, C3 and C4 are connected in parallel. Therefore the value of Cf is increased and is expressed as: Cf=C3+C4.

Accordingly, by simultaneously opening S1, S2 and S3, the capacitance values Ct and Cf of the filter are decreased and result in a filter response with a first cut off frequency, F1. When the switches S1, S2 and S3 are all closed, the capacitance values Ct and Cf are increased, resulting in a second filter response with a second cut off frequency, F2, where F2<F1.

While the circuit of FIG. 2 provides a selectable two-frequency response, this circuit topology has several disadvantages associated with the floating or flying configuration of the switches S2 and S3. Because of the floating configuration of the switches S2 and S3, at least a portion of the feedback signal is passed through these switches. Initially, it should be noted that typical electrically controllable switches deviate from that of ideal switches in that when "closed," the resistance is not zero ohms and when "open" the resistance across the switch is not infinite. In addition, the resistance of the switch can be modulated by the applied signal flowing through the switch. These factors result in signal distortion. Also, the switches S2 and S3, which generally take the form of CMOS analog switches, introduce significant parasitic capacitance to the circuit. Further, because the total feedback current is always flowing into the inverting terminal (virtual ground) of the operational amplifier regardless of the condition of the switches S2, S3, the Q and frequency response of this circuit is limited and good phase control without individual adjustment is only attainable at frequencies up to about 10% of the unity gain crossover frequency of the operational amplifier.

OBJECTS AND SUMMARY OF THE INVENTION

It is an object of the present invention to provide an improved switchable, second order low pass filter.

It is another object of the present invention to provide a switchable, second order low pass filter with improved phase control at frequencies approaching the unity gain crossover frequency of an operational amplifier.

It is yet another object of the present invention to provide a switchable low pass filter well suited for use in a read/write channel of a tape storage system.

It is still another object of the present invention to provide a switchable active filter which does not employ a flying or floating switch configuration.

It is yet another object of the present invention to provide a circuit which alters the magnitude of the current flowing into a virtual ground terminal of the circuit without altering the phase of the current.

It is still another object of the present invention to provide a method of enhancing a circuits frequency response by altering the magnitude of the current flowing into a virtual ground terminal of the circuit without altering the phase of the current.

In accordance with one form of the present invention, a switchable active filter circuit is formed which includes an operational amplifier having an input terminal and an output terminal. The circuit further includes a switchable feedback tee which is formed with a first capacitor, a second capacitor, a third capacitor and a first switch. The first capacitor and the second capacitor form a first series circuit which is connected from the output terminal to the input terminal of the operational amplifier. The third capacitor and the first switch are connected as a second series circuit which is coupled from circuit ground potential to a junction of the first capacitor and the second capacitor. The active filter circuit also includes a first resistor, a second resistor and a third resistor. The first resistor and the second resistor are connected in series with each other and are coupled from an input terminal of the filter to the input terminal of the operational amplifier. The third resistor is coupled between the output terminal of the operational amplifier and a junction of the first resistor and the second resistor. The circuit further includes a fourth capacitor and a second switch. The fourth capacitor is coupled in series with the second switch from the junction of the first resistor and the second resistor to circuit ground potential. In this circuit topology, the frequency response and circuit Q of the filter are switchable by operating the first switch and second switch between an open condition and a closed condition.

In accordance with another form of the present invention, a switchable active filter circuit for use in a read/write channel of a tape storage system is formed which includes an operational amplifier having an input terminal and an output terminal. The filter circuit further includes a switchable feedback tee which is formed with a first capacitor, a second capacitor, a third capacitor and a first switch. The first capacitor and the second capacitor form a first series circuit which is connected from the output terminal to the input terminal of the operational amplifier. The third capacitor and the first switch are connected as a second series circuit which is coupled from circuit ground potential to a junction of the first capacitor and the second capacitor. The active filter circuit also includes a first resistor, a second resistor and a third resistor. The first resistor and the second resistor are connected in series with each other and are coupled from an input terminal of the filter to the input terminal of the operational amplifier. The third resistor is coupled between the output terminal of the operational amplifier and a junction of the first resistor and the second resistor. The circuit further includes a fourth capacitor and a second switch. The fourth capacitor is coupled in series with the second switch from the junction of the first resistor and the second resistor to circuit ground potential. In this circuit topology, the frequency response and circuit Q of the filter are switchable by operating the first switch and second switch between an open condition and a closed condition, allowing a single filter topology to be used with multiple tape storage media formats.

In accordance with yet another embodiment of the present invention, a switchable integrator circuit is formed using an operational amplifier and a switchable tee feedback circuit. The operational amplifier includes a virtual ground input terminal and an output terminal. The integrator circuit further includes a resistor connected to the virtual ground input terminal of the operational amplifier. The switchable feedback tee includes a first capacitor, a second capacitor, a third capacitor and a switch. The first capacitor and said second capacitor form a first series circuit from the output terminal to the virtual ground input terminal of the operational amplifier. The third capacitor and switch are connected as a second series circuit which is coupled from circuit ground potential to a junction of the first capacitor and the second capacitor. The integrator circuit exhibits a first time constant when the switch is in an open condition and a second time constant, lower than the first time constant, when the switch is in a closed condition.

In accordance with the present invention, a method of enhancing the performance of a circuit having a virtual ground terminal with a current flowing into the virtual ground terminal with a phase value is disclosed. The method includes the steps of: dividing the current into a first current and a second current; directing the first current into the virtual ground terminal with the first phase value; and directing the second current away from the virtual ground terminal and into a circuit ground potential.

These and other features, objects and advantages of the present invention will become apparent from the following detailed description of illustrative embodiments thereof, which is to be read in connection with the accompanying drawings.

DETAILED DESCRIPTION OF PREFERRED EMBODIMENTS

Figure 3:
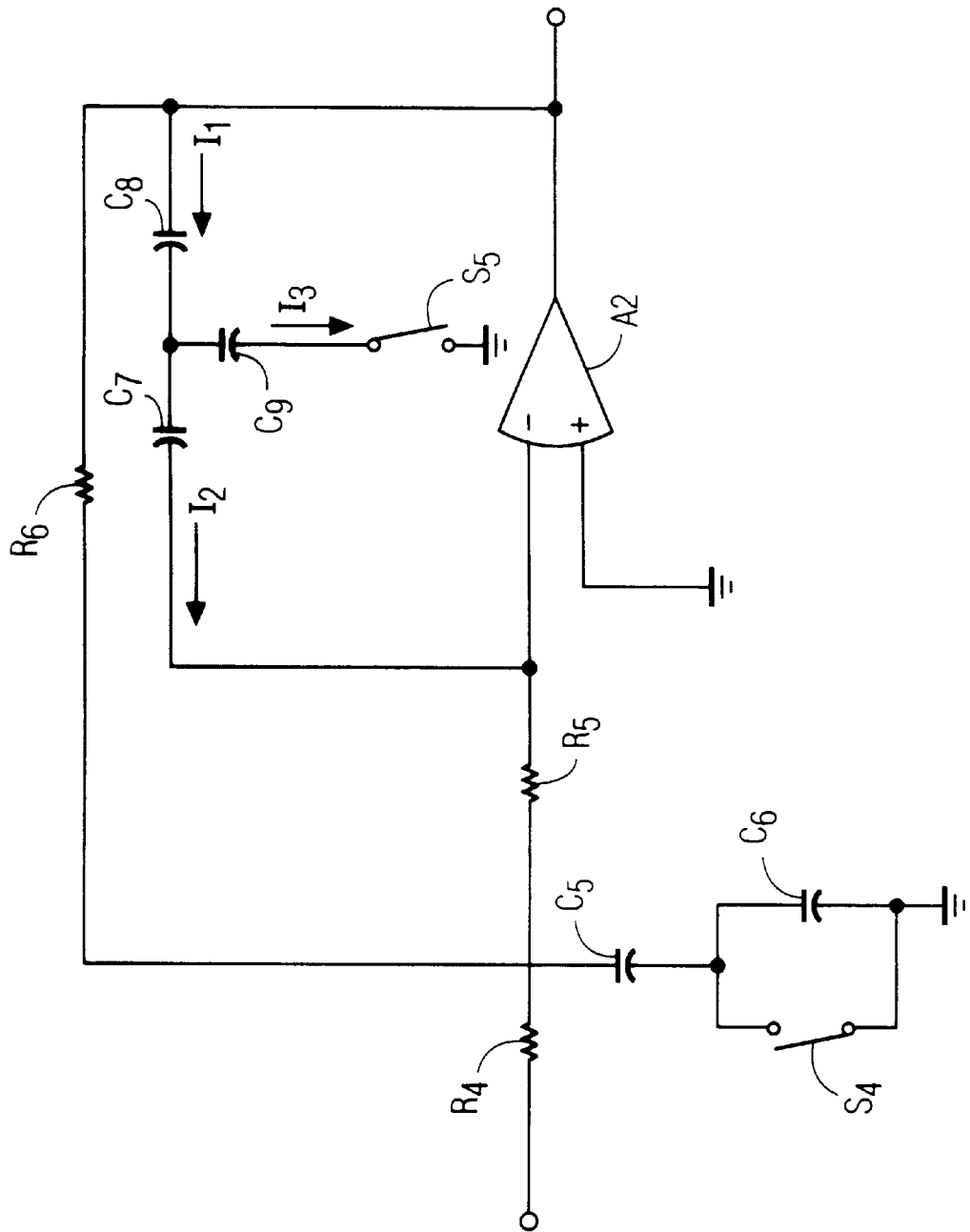
FIG. 3 is a schematic diagram illustrating a switchable second order low pass filter formed in accordance with the present invention.

FIG. 3 is a schematic diagram illustrating one embodiment of a switchable second order low pass filter formed in accordance with the present invention. Referring to FIG. 3, the circuit includes an operational amplifier A2 which operates as the active element. The input of the circuit is applied to a first resistor R4 which is connected in series with a second resistor R5 and through the second resistor R5 to an inverting input of the operational amplifier A2. At the junction of resistors R4 and R5 is a first capacitor C5 which is connected in series with a second capacitor C6. The series combination of capacitors C5 and C6 is also connected to a circuit ground potential.

A first electrically controllable switch S4 is coupled across the second capacitor C6. By operating the first switch S4, the total capacitance of the series circuit is altered. When the first switch S4 is in an open condition, the total capacitance is equal to the series combination of capacitors C5 and C6 which is stated as:

$$Ct=(C5*C6)/(C5+C6)$$

where Ct is the total capacitance of the series circuit. When the first switch S4 is in a closed condition, the second capacitor C6 is bypassed and Ct=C5. Accordingly, when the first switch S4 is closed, Ct is a larger value which will result in a lower frequency response of the filter.

The circuit further includes a third resistor R6 which is coupled in feedback from the output of the operational amplifier A2 to the junction of R4 and R5. A third capacitor C7 is connected in series with a fourth capacitor C8 and the series combination is coupled from the output of the operational amplifier A2 to the inverting input of the operational amplifier A2. To complete the circuit, a series circuit is formed with second electrically controllable switch S5 and a fifth capacitor C9. The series combination of capacitor C9 and the second switch S5 is connected from the junction of C7 and C8 to circuit ground, thereby forming a switchable capacitor tee network. When switch S5 is in an open condition, the total value of the feedback capacitance, Cf, is equal to the series combination of capacitors C7 and C8, which is stated as Cf=(C7*C8)/(C7+C8). When S5 is in a closed condition, capacitor C9 is brought into the circuit. As C7 is connected to the virtual ground connection of the operational amplifier A2 and C9 is connected to circuit ground through the switch S5, capacitors C9 and C7 combine in parallel and the value of Cf is increased. The value of Cf is expressed as:

Cf=((C7+C9)*C8)/(C7+C8+C9).

However, because the capacitor tee structure results in a current division with only a portion of the total feedback current flowing into the virtual ground terminal of the operational amplifier, the effective value of the feedback capacitance, $Cf_{eff}$ is not equal to Cf when the second switch S5 is closed.

The key parameters for this exemplary filter topology namely, the filter corner frequency $\omega_n$, the filter Q and the DC gain $H_o$ can be stated as:

$$\omega_n = \frac{1}{\sqrt{R5 \cdot R6 \cdot Ct \cdot Cf_{eff}}} \quad \text{Eq. 1}$$

$$\frac{1}{Q} = \sqrt{\frac{Cf_{eff}}{Ct}} \cdot \left( \sqrt{\frac{R6 \cdot R5}{R4}} + \sqrt{\frac{R5}{R6}} + \sqrt{\frac{R6}{R5}} \right) \quad \text{Eq. 2}$$

$$H_o = \frac{R6}{R4} \quad \text{Eq. 3}$$

From Eq. 1 and Eq. 2 above, it is clear that the corner frequency is proportional to the magnitude of the product of Ct and $Cf_{eff}$ while the Q of the filter is proportional to the ratio of the magnitude of Ct and $Cf_{eff}$. Therefore, within limits, the corner frequency of the filter and circuit Q can be independently altered by the operation of switches S4 and S5.

The grounded tee configuration of capacitors C7, C8 and C9 is an important aspect of the present invention. When switch S5 is in the open condition, a feedback current ($I_1$) flows through capacitors C7 and C8 into the virtual ground terminal of the operational amplifier A2. When the switch S5 is closed, the effective feedback capacitance, Cf, increases and the total AC feedback current, $i_1$ also increases. However, because C7 and C9 are connected in a parallel circuit topology, the current $i_1$ divides with a portion of the current flowing through C7 ($I_2$) and a portion of the current flowing through C9 ($I_3$) to circuit ground. Therefore, the current flowing into the virtual ground terminal of the operational amplifier A2 does not substantially increase. Mathematically, this can be expressed as:

$$I_1 = j \cdot \omega \cdot C7 \cdot \frac{(C8 + C9)}{C7 + C8 + C9} \cdot E_o \quad \text{Eq. 4}$$

$$I_1 = I_2 + I_3 \quad \text{Eq. 5}$$

$$I_3 = I_2 \frac{C8}{C9} \quad \text{Eq. 6}$$

where $E_o$ is a voltage at the output terminal of the operational amplifier A2. It will be appreciated by those skilled in the art that while the magnitude of the current flowing into the virtual ground terminal ($I_2$) is reduced by the magnitude of $I_3$, the phase of this current is unaltered.

Preferably, capacitors C7 and C8 are of equal value so as to maximize the value of the series combination. When this is the case, the effective value of the feedback capacitance $Cf_{eff}$, and the magnitude of the current flowing through C9 when S5 is closed can be expressed as:

$$Cf_{eff} = \frac{C8}{\left(2 + \frac{C9}{C8}\right)} \quad \text{Eq. 7}$$

$$I_3 = j \cdot \omega \cdot \frac{C8}{\left(2 + \frac{C9}{C8}\right)} \cdot E_o \quad \text{Eq. 8}$$

As equation 7 illustrates, the magnitude of the effective capacitance decreases when the second switch is closed, thereby increasing the corner frequency of the filter circuit. Accordingly, by opening the first switch S4 and closing the second switch S5, the capacitance values Ct and $Cf_{eff}$ of the filter are decreased which results in a filter response with a first cut off frequency, $\omega 1$. When the first switch S4 is closed and second switch S5 is opened, the capacitance values Ct and $Cf_{eff}$ are increased, resulting in a second filter response with a second cut off frequency, $\omega 2$, where $\omega 2 < \omega 1$.

It will be appreciated that the grounded configuration of switch S5 allows the use of a simple, high speed transistor as the switching element rather than requiring a CMOS analog switch. This improves circuit performance by reducing the parasitic capacitance associated with the switch S5.

Figures 1, 1A, 1B:
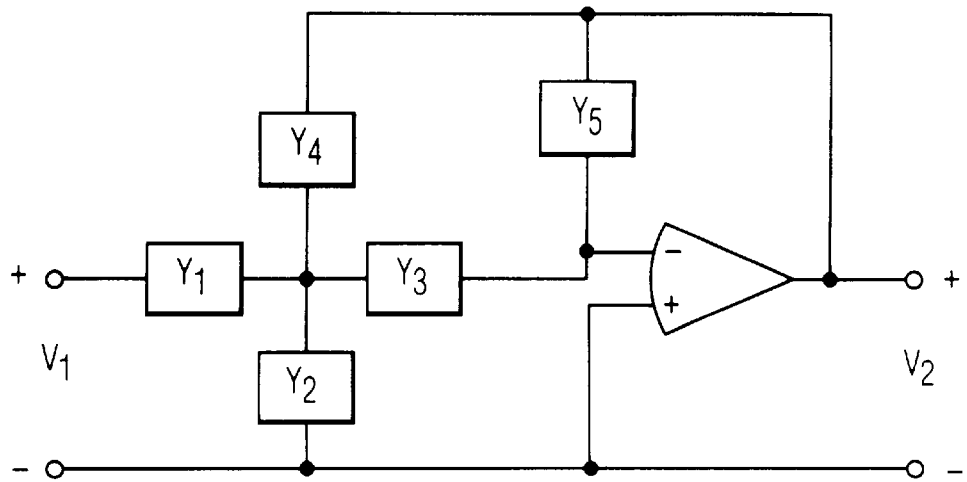
FIG. 1 is a generalized schematic of an active filter known in the prior art.
FIG. 1A is an equation describing the general transfer function of the circuit of FIG. 1.
FIG. 1B is a table describing the component selections required to attain specific filter responses from the topology of FIG. 1.
Figure 2:
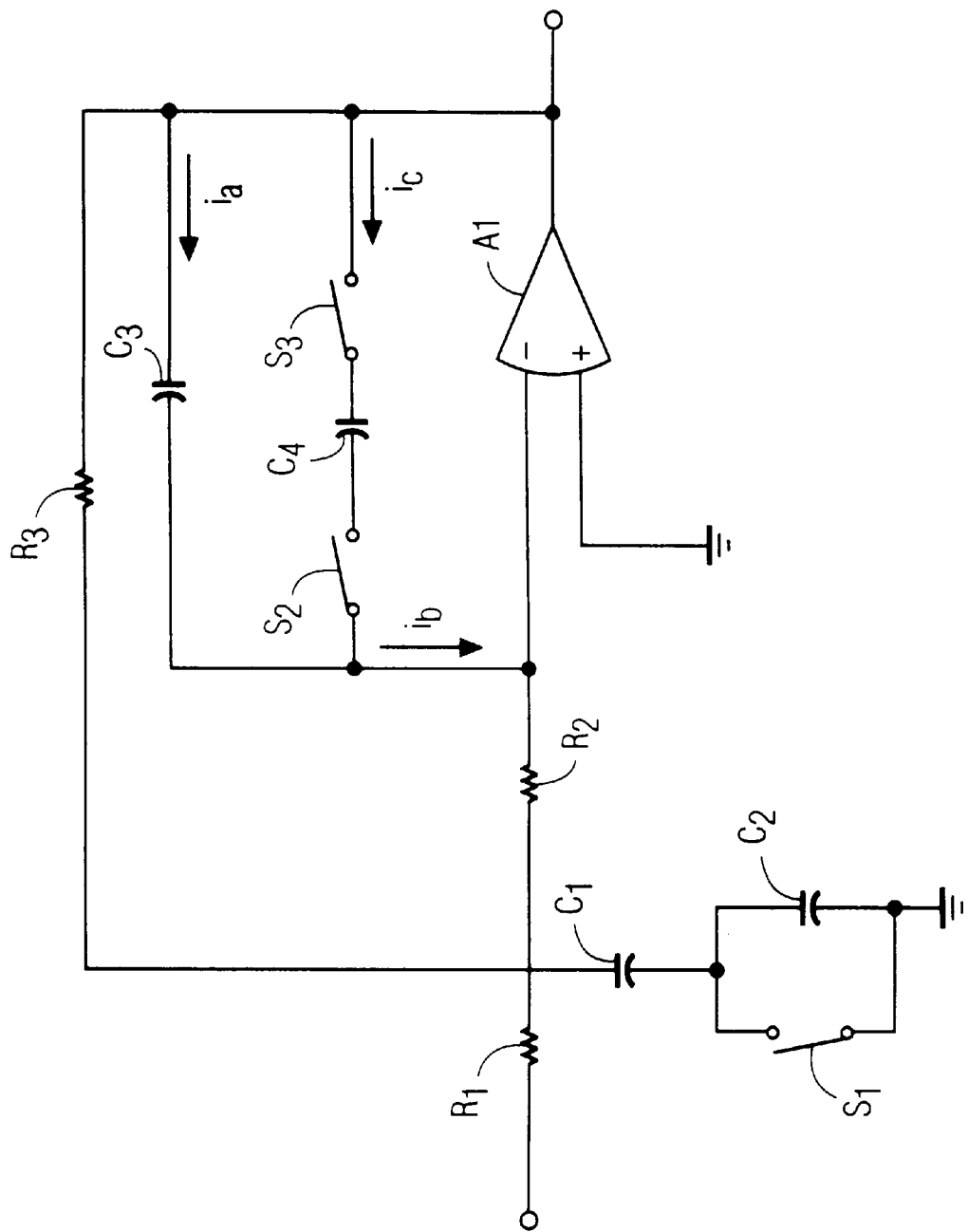
FIG. 2 is a schematic diagram illustrating a switchable second order low pass filter known in the prior art.

The capacitor tee topology of the present invention provides greater phase control and frequency response for frequencies that are approaching an octave of the unity gain crossover frequency of the amplifier A2. Previously, as with the circuit of FIG. 2, to achieve reasonable phase control, the filter corner frequency needed to be selected at a frequency of no more than approximately a decade away from the unity gain crossover frequency of the amplifier A2.

A switchable second order low pass filter formed in accordance with the present invention is particularly well suited for use in a read/write channel of a tape storage system. In this application, the operating frequency is about 1.4 megahertz for older media storage formats and about 5 megahertz for newer, high density media storage formats. In the latter case, reasonable phase control is required up to about 10 megahertz. The switchable filter configuration of the present invention provides two operating modes, making the system capable supporting both the new formats and old formats, allowing backward compatibility with existing tape storage formats in use in the media storage field.

Figure 4A:
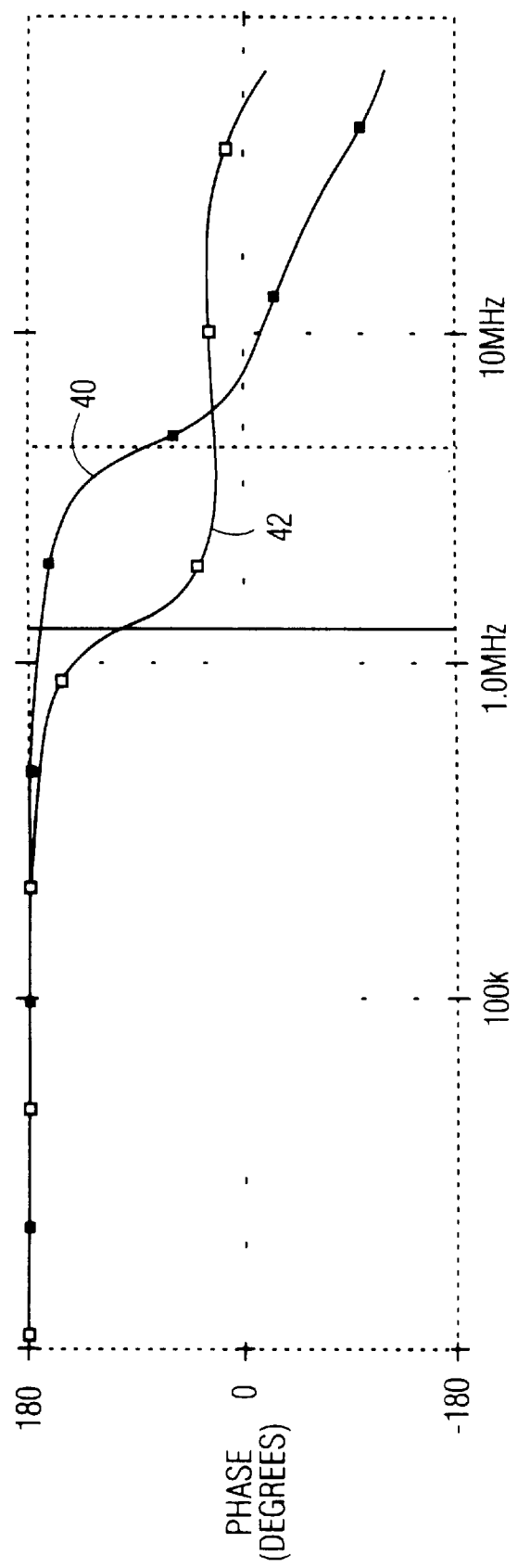
FIGS. 4A and 4B are graphs of phase versus frequency and amplitude versus frequency, respectively, for an exemplary embodiment of a switchable second order low pass filter formed in accordance with the present invention.
Figure 4B:
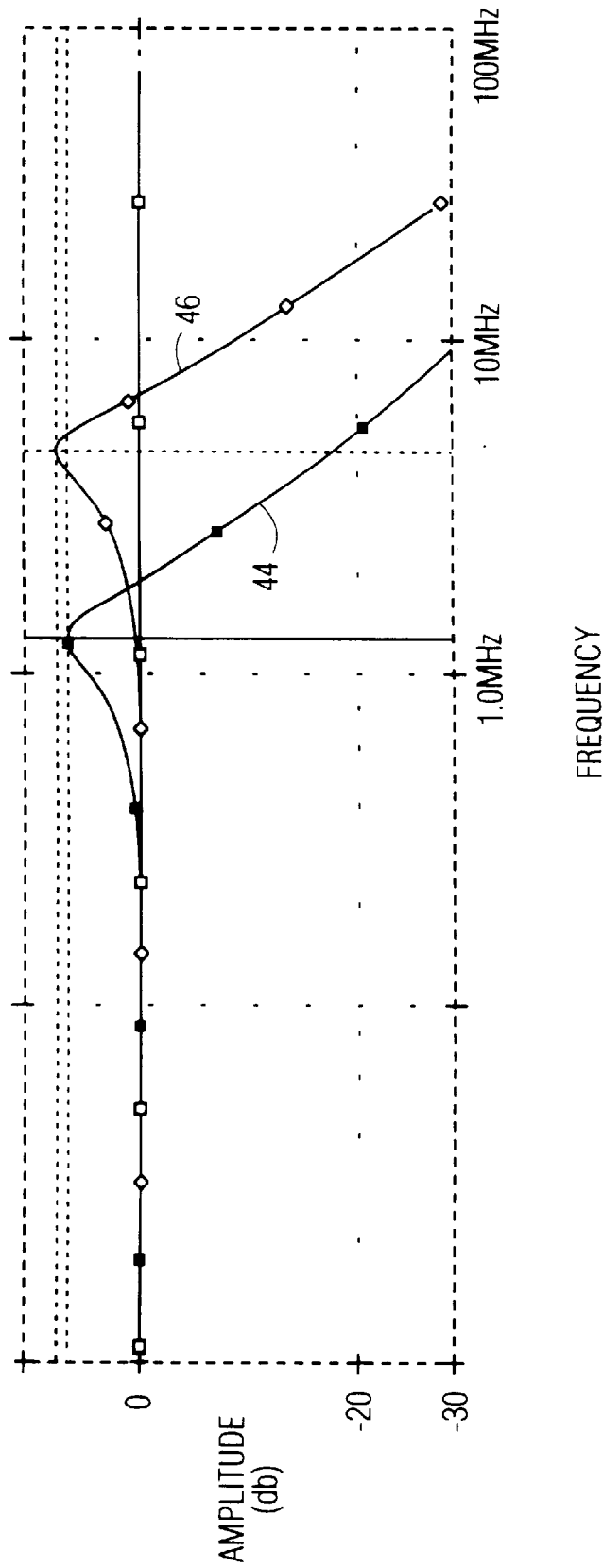

FIGS. 4A and 4B illustrate the performance of an exemplary switchable second order lowpass filter formed in accordance with the present invention. Referring to FIG. 3, the circuit is formed with the following values: R4=1200 Ω; R6=1200 Ω; R5=220 Ω; C5=1200 pf; C6=180 pF; C7=47 pf; C7=47 pf and C9=180 pf. Referring to FIG. 4A, phase plots are illustrated in a first operating mode with the first switch S4 closed and the second switch S5 open 40 and also in a second operating mode with the first switche S4 open and the second switch S5 closed 42. Referring to FIG. 4B, graphs of gain versus frequency, corresponding to FIG. 4A, illustrate the frequency response of the filter in the first operating mode 44 and also in the second operating mode 46.

The operation of the second switch S5 in the exemplary embodiment of the present invention functions to divide a current and direct a portion of the current into a virtual ground terminal of an operational amplifier and the balance of the current into a circuit ground potential, thus altering the magnitude of the current without altering the phase of the current. This method of enhancing circuit performance can be extended to nearly any circuit having a current flowing into a virtual ground terminal, and is not limited to capacitor switching nor switching in a feedback circuit. For example, the present invention can be applied to other filter topologies known in the art as well as to a simple integrator circuit, as illustrated in FIG. 5.

Figure 5:
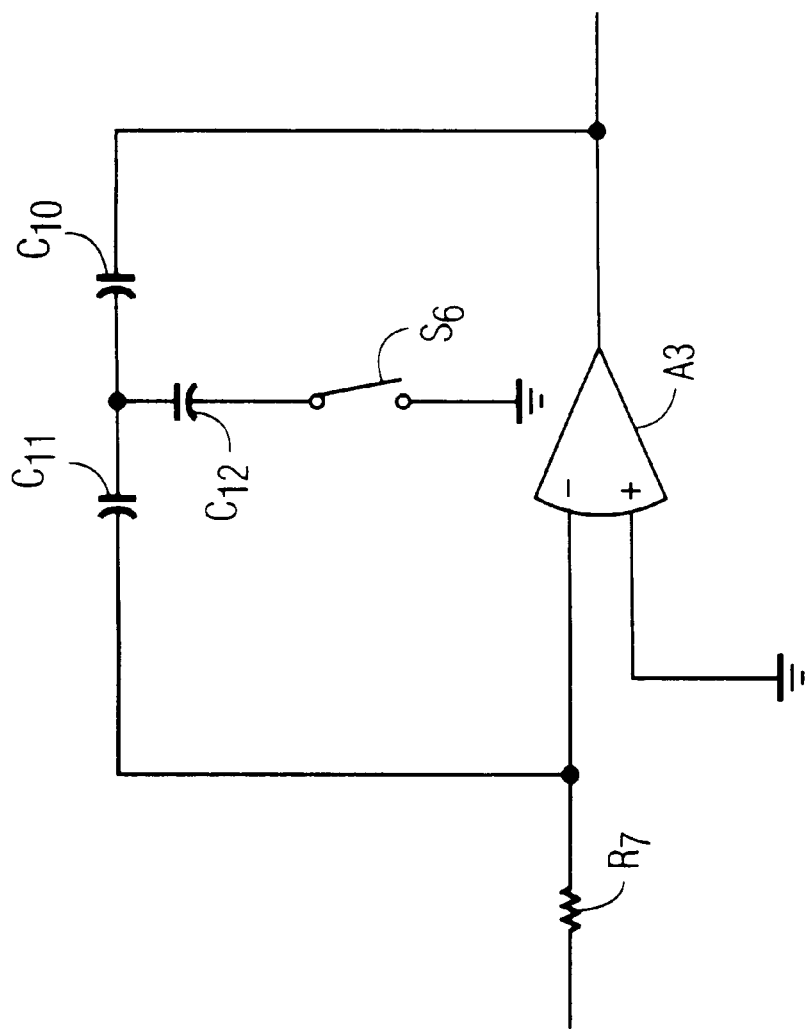
FIG. 5 is a schematic diagram of a switchable integrator circuit formed in accordance with the present invention.

Referring to FIG. 5, the integrator circuit has a first time constant when switch S6 is open and a second time constant when the switch S6 is closed. The value of the time constant is the product of a resistor value R10 and the effective value of the feedback capacitance, Ceff. Assuming that capacitors C10 and C11 have an equal value, when the switch S6 is open Ceff=C11*C10/(C11+C10) and when the switch is open the effective capacitance has a value of: Ceff=C10/(2+(C12/C10). By closing the switch S6, a portion of the current is diverted from the virtual ground terminal of the operational amplifier A3 and into circuit ground, thereby reducing the time constant of the integrator.

Having described preferred embodiments of the present invention, it is noted that modifications and variations can be effected by those skilled in the art in light of the above teachings. It is therefore to be understood that changes may be made in the particular embodiments of the invention which are within the scope and spirit of the invention as outlined by the appended claims.

What is claimed is:

1. A switchable active filter circuit comprising:

an operational amplifier having an input terminal and an output terminal;

a switchable feedback tee, said feedback tee including a first capacitor, a second capacitor, a third capacitor and a first switch, said first capacitor and said second capacitor forming a first series circuit from said output terminal to said input terminal of said operational amplifier, said third capacitor and said first switch being connected as a second series circuit having a first terminal coupled to a circuit ground potential and a second terminal coupled to a junction of said first capacitor and said second capacitor;

a first resistor, a second resistor and a third resistor, said first resistor and said second resistor connected in a series between a signal input terminal of the filter and said input terminal of said operational amplifier, said third resistor coupled between said output terminal of said operational amplifier and a junction of said first resistor and said second resistor;

a fourth capacitor; and a second switch, said fourth capacitor coupled in series with said second switch from the junction of said first resistor and said second resistor to circuit ground potential, whereby a frequency response and a circuit Q of the filter are switchable by operating the first switch and second switch.

2. A switchable active filter circuit as defined by claim 1, wherein the first capacitor and second capacitor have an equal capacitance value.

3. A switchable active filter circuit as defined by claim 1, wherein the first switch and second switch are electrically controllable switches.

4. A switchable active filter circuit as defined by claim 3, wherein the first switch is a transistor switch.

5. A switchable active filter circuit as defined by claim 4, wherein the filter operates at a first frequency and a first Q when said first switch is in a closed condition and said second switch is in an open condition and the filter operates at a second frequency and a second Q when said first switch is in an open condition and said second switch is in a closed condition.

6. A switchable active filter circuit as defined by claim 5, wherein said first frequency is about 1.4 megahertz and said second frequency is about 5 megahertz.

7. An active filter for use in a read/write channel of a tape storage system, the filter comprising:

an operational amplifier having an input terminal and an output terminal;

a switchable feedback tee, said feedback tee including a first capacitor, a second capacitor, a third capacitor and a switch, said first capacitor and said second capacitor forming a first series circuit from said output terminal to said input terminal of said operational amplifier, said third capacitor and said switch being connected as a second series circuit having a first terminal coupled to a circuit ground potential and a second terminal coupled to a junction of said first capacitor and said second capacitor;

a first resistor, a second resistor and a third resistor, said first resistor and said second resistor connected in a series between an input terminal of the filter and said input terminal of said operational amplifier, said third resistor coupled between said output terminal of said operational amplifier and a junction of said first resistor and said second resistor;

a fourth capacitor; and a second switch, said fourth capacitor coupled in series with said second switch from the junction of said first resistor and said second resistor to circuit ground potential, whereby the filter is compatable with at least two media storage format signals by operating the first switch and second switch.

8. A switchable active filter circuit as defined by claim 7, wherein the first capacitor and second capacitor have an equal capacitance value.

9. A switchable active filter circuit as defined by claim 7, wherein the first switch and second switch are electrically controllable switches.

10. A switchable active filter circuit as defined by claim 9, wherein the first switch is a transistor switch.

11. A switchable active filter circuit as defined by claim 9, wherein the filter operates at a first frequency and a first Q when said first switch is in a closed condition and said second switch is in an open condition and the filter operates at a second frequency and a second Q when said first switch is in an open condition and said second switch is in a closed condition, said first frequency and first Q corresponding to a first media format signal and said second frequency and said second Q corresponding to a second media format signal.

12. A switchable active filter circuit as defined by claim 11, wherein said first frequency is about 1.4 megahertz and said second frequency is about 5 megahertz.

13. A switchable integrator circuit comprising:

an operational amplifier having a virtual ground input terminal and an output terminal;

a resistor connected to said virtual ground input terminal of said operational amplifier; and a switchable feedback tee, said feedback tee including a first capacitor, a second capacitor, a third capacitor and a switch, said first capacitor and said second capacitor forming a first series circuit from said output terminal to said input terminal of said operational amplifier, said third capacitor and said switch being connected as a second series circuit having a first terminal coupled to a circuit ground potential and a second terminal coupled to a junction of said first capacitor and said second capacitor, whereby the integrator exhibits a first time constant when said switch is in an open condition and a second time constant, lower than the first time constant, when said switch is in a closed condition.

* * * * *